US012745518B2

(12) United States Patent
Ha et al.

(10) Patent No.: US 12,745,518 B2
(45) Date of Patent: Sep. 22, 2026

(54) DISPLAY PANEL THAT PREVENTS AND MINIMIZES DEVIATION OF INITIALIZATION VOLTAGES AND DISPLAY DEVICE INCLUDING THE SAME

(71) Applicant: Samsung Display Co., LTD., Yongin-si (KR)

(72) Inventors: Tae-Seok Ha, Hwaseong-si (KR); Kyoungsoo Kim, Suwon-si (KR); Kyu-Jin Park, Hwaseong-si (KR); Sung-Jae Park, Seongnam-si (KR); Seung-Woon Shin, Asan-si (KR); Ho Lee, Seoul (KR); Woon-Rok Jang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 688 days.

(21) Appl. No.: 17/865,336

(22) Filed: Jul. 14, 2022

(65) Prior Publication Data

US 2023/0119488 A1 Apr. 20, 2023

(30) Foreign Application Priority Data

Oct. 15, 2021 (KR) ........................ 10-2021-0137405

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02); *H10K 59/1216* (2023.02)

(58) Field of Classification Search
CPC ............. H10K 59/131; H10K 59/1213; H10K 59/1216; H10K 59/12; G09G 3/3233; G09G 2300/043; G09G 2300/0819; G09G 2310/0251; G09G 2310/0262; G09G 2320/0233; G09G 2320/0295; G09G 2320/043; G09G 3/3225; G09G 3/3266
See application file for complete search history.

(56) References Cited

U.S. PATENT DOCUMENTS 9,620,053 B2 4/2017 Kim et al.
10,777,628 B2 9/2020 Kim et al.
10,964,771 B2 3/2021 Lee et al.
(Continued)

FOREIGN PATENT DOCUMENTS

KR 10-2000-0046716 7/2000
KR 10-1368244 2/2014
(Continued)

OTHER PUBLICATIONS

Korean Office Action dated Feb. 17, 2025, in Korean Patent Application No. 10-2021-0137405.

*Primary Examiner* — Jacob Y Choi
*Assistant Examiner* — Grace Cha
(74) *Attorney, Agent, or Firm* — Sughrue Mion, PLLC

(57) ABSTRACT

A display panel may include a plurality of pixels, a plurality of initialization lines for providing an initialization voltage to the plurality of pixels, a common line physically separated from the plurality of initialization lines, and a plurality of switching elements each including a first electrode connected to a respective one of the plurality of initialization lines and a second electrode connected to the common line.

9 Claims, 8 Drawing Sheets

(56) References Cited

U.S. PATENT DOCUMENTS

| | | | | |
|---|---|---|---|---|
| 2014/0191931 | A1* | 7/2014 | Kim | G09G 3/3685 345/76 |
| 2017/0154578 | A1* | 6/2017 | In | G09G 3/3283 |
| 2018/0006105 | A1* | 1/2018 | Kim | H10K 59/1213 |
| 2021/0151539 | A1* | 5/2021 | Yun | G09G 3/20 |
| 2021/0241686 | A1* | 8/2021 | Cheng | G09G 3/3291 |

FOREIGN PATENT DOCUMENTS

| | | |
|---|---|---|
| KR | 10-2018-0002991 | 1/2018 |
| KR | 10-2018-0004382 | 1/2018 |
| KR | 10-2019-0079826 | 7/2019 |
| KR | 10-2020-0051108 | 5/2020 |
| KR | 10-2020-0072956 | 6/2020 |
| KR | 10-2021-0007508 | 1/2021 |

* cited by examiner 100
130
DATA DRIVER
DATA
110
DISPLAY PANEL
PX
VINIT, ELVDD, ELVSS
POWER SUPPLY
140
VSEN
SENSING CIRCUIT
150
SC, SS, ISS
TIMING CONTROLLER
160
SCAN DRIVER
120

100
PCB
140
IVSL2
FFC
PBA
COF
110
D-IC
A2
IL2
CTL
IL1
IL
A1
A
IVSL1
DR1
DR2

FIG. 4

A
PX
IL
TR
CAP
ISL
ISS
CML
DR1
DR2

A
PX
IL
TR
CAP
ISL
ISS
CML
DR1
DR2

DISPLAY PANEL THAT PREVENTS AND MINIMIZES DEVIATION OF INITIALIZATION VOLTAGES AND DISPLAY DEVICE INCLUDING THE SAME

CROSS-REFERENCE TO RELATED APPLICATION

This application claims priority from and the benefit of Korean Patent Application No. 10-2021-0137405, filed on Oct. 15, 2021, which is hereby incorporated by reference for all purposes as if fully set forth herein.

BACKGROUND

Field

Embodiments of the invention relate generally to a display device and more specifically, to a display device including initialization lines for a sensing operation and an initialization operation.

Discussion of the Background

A display device may include a display panel with a plurality of pixels. Each of the pixels may emit light, and the display panel may display an image by the light emitted from the plurality of pixels.

Initialization voltages may be provided to the plurality of pixels through a plurality of initialization lines. The initialization voltage may initialize a transistor and/or a light emitting element included in the pixel. However, when a deviation in the initialization voltages provided to the pixels increases due to noise, etc., brightness of an image displayed from the display panel may be non-uniform.

The above information disclosed in this Background section is only for understanding of the background of the inventive concepts, and, therefore, it may contain information that does not constitute prior art.

SUMMARY

Applicant discovered that when initialization lines, which transmit initialization voltages for pixels of a display device, are affected by noise, the deviation of the initialization voltages may increase.

Display devices constructed according to the principles and embodiments of the invention are capable of improving the image quality by preventing and minimizing the deviation of the initialization voltages.

For example, the display devices may include a display panel including a common line physically separated from the initialization lines. The common line may be selectively connected to the initialization lines by switching elements, e.g., transistors, connected between the common line and the initialization lines. Thus, the deviation of initialization voltages applied to the display panel may be reduced. Accordingly, the brightness of an image displayed from the display panel may be uniform.

Additional features of the inventive concepts will be set forth in the description which follows, and in part will be apparent from the description, or may be learned by practice of the inventive concepts.

According to an aspect of the invention, a display panel includes a plurality of pixels; a plurality of initialization lines for providing an initialization voltage to the plurality of pixels; a common line physically separated from the plurality of initialization lines; and a plurality of switching elements each having a first electrode connected to a respective one of the plurality of initialization lines and a second electrode connected to the common line.

The display panel may further include an initialization synchronization line connected to gate electrodes of the plurality of switching elements.

The plurality of switching elements may be turned on in a display period in which each of the plurality of pixels emits light, and the plurality of switching elements may be turned off in a sensing period in which a characteristic of each of the plurality of pixels is sensed.

Each of the plurality of initialization lines may extend in a first direction, and the common line may extend in a second direction intersecting the first direction.

The display panel may further include a capacitor connected to the common line.

The display panel may further include a plurality of capacitors connected to the common line.

The number of the plurality of capacitors may be equal to the number of the plurality of switching elements.

Each of the plurality of switching elements may be an NMOS transistor.

Each of the plurality of switching elements may be an oxide semiconductor transistor.

Each of the plurality of pixels may include: a first transistor connected between a first power line for providing a first power voltage and a first node, the first transistor including a gate electrode connected to a second node; a second transistor connected between a data line for providing a data voltage and the second node, the second transistor being turned on in response to a scan signal; a third transistor connected between a respective one of the plurality of initialization lines and the first node, the third transistor being turned on in response to a control signal; a storage capacitor connected between the first node and the second node; and a light emitting element connected between a second power line for providing a second power voltage and the first node.

According to another aspect of the invention, a display device includes a display panel including a plurality of pixels; a scan driver for providing a scan signal and a control signal to the display panel; a data driver for providing a data voltage to the display panel; a sensing circuit sensing a characteristic of each of the plurality of pixels; a power supply for generating an initialization voltage; a plurality of initialization lines for providing the initialization voltage to the plurality of pixels; a common line physically separated from the plurality of initialization lines; and a plurality of switching elements each having a first electrode connected to a respective one of the plurality of initialization lines and a second electrode connected to the common line.

The display device may further include: a first initialization voltage supply line for providing the initialization voltage to first initialization lines disposed in a first area of the display panel among the plurality of initialization lines from the power supply; and a second initialization voltage supply line for providing the initialization voltage to second initialization lines disposed in a second area of the display panel among the plurality of initialization lines from the power supply.

The first area may be positioned on one side of the display panel with respect to an imaginary center line passing through a center portion of the display panel and parallel to the plurality of initialization lines, and the second area may be positioned on another side of the display panel with respect to the center line.

The display device may further include an initialization synchronization line connected to gate electrodes of the plurality of switching elements.

The scan driver may be to provide an initialization synchronization signal to the initialization synchronization line.

The plurality of switching elements may be turned on in a display period in which each of the plurality of pixels emits light, and the plurality of switching elements may be turned off in a sensing period in which a characteristic of each of the plurality of pixels is sensed.

The display device may further include a switch for electrically connecting each of the plurality of initialization lines to the power supply in the display period and for electrically connecting each of the plurality of initialization lines to the sensing circuit in the sensing period.

Each of the plurality of initialization lines may extend in a first direction, and the common line may extend in a second direction intersecting the first direction.

The display device may further include a capacitor connected to the common line.

Each of the plurality of pixels may include: a first transistor connected between a first power line for providing a first power voltage and a first node, the first transistor including a gate electrode connected to a second node; a second transistor connected between a data line for providing the data voltage and the second node, the second transistor being turned on in response to the scan signal; a third transistor connected between a respective one of the plurality of initialization lines and the first node, the third transistor being turned on in response to the control signal; a storage capacitor connected between the first node and the second node; and a light emitting element connected between a second power line for providing a second power voltage and the first node.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 4 is a schematic diagram of an example of an area A of FIG. 3.

DETAILED DESCRIPTION OF THE EMBODIMENTS

Figure 1:
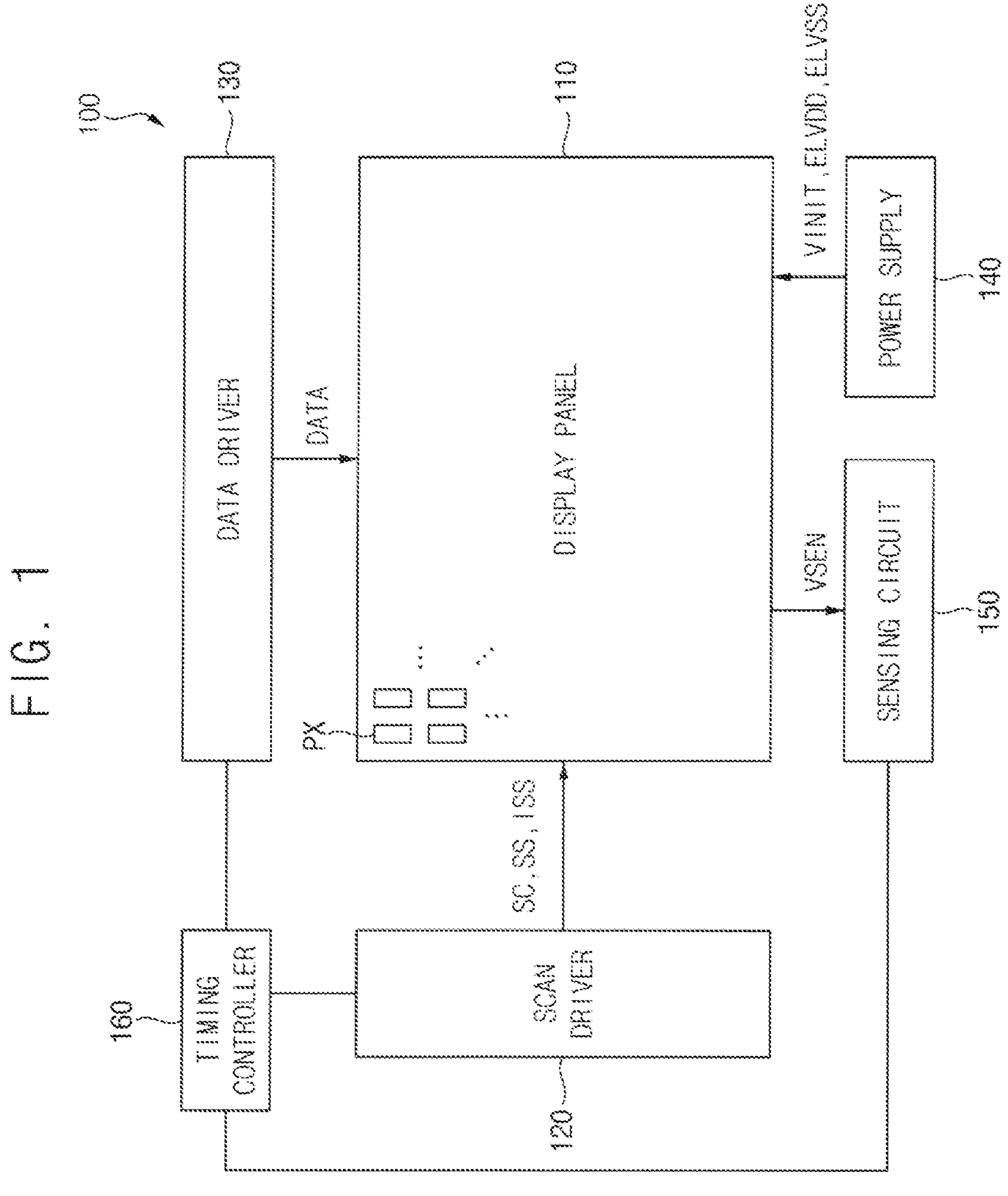
FIG. 1 is a block diagram of an embodiment of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display devices and display panels in accordance with embodiments will be explained in detail with reference to the accompanying drawings.

FIG. 1 is a block diagram illustrating a display device 100 according to an embodiment.

Referring to FIG. 1, the display device 100 may include a display panel 110, a scan driver 120, a data driver 130, a power supply 140, a sensing circuit 150, and a timing controller 160.

The display panel 110 may include a plurality of pixels PX. The display panel 110 may receive a scan signal SC, a control signal SS, and an initialization synchronization signal ISS from the scan driver 120. The display panel 110 may receive a data voltage DATA from the data driver 130. The display panel 110 may receive an initialization voltage VINIT, a first power voltage ELVDD, and a second power voltage ELVSS from the power supply 140. The display panel 110 may provide a sensing voltage VSEN to the sensing circuit 150. Each of the pixels PX may emit light based on the scan signal SC, the control signal SS, the data voltage DATA, the initialization voltage VINIT, the first power voltage ELVDD, and the second power voltage ELVSS.

The scan driver 120 may provide the scan signal SC, the control signal SS, and the initialization synchronization signal ISS to the display panel 110. The scan signal SC and the control signal SS may be provided to each of the pixels PX. The initialization synchronization signal ISS may be provided to each of switching elements in the form of the transistors TR in FIG. 4.

The data driver 130 may provide the data voltage DATA to the display panel 110. The data voltage DATA may be provided to each of the pixels PX.

The power supply 140 may provide the initialization voltage VINIT, the first power voltage ELVDD, and the second power voltage ELVSS to the display panel 110. The initialization voltage VINIT, the first power voltage ELVDD, and the second power voltage ELVSS may be provided to each of the pixels PX.

The sensing circuit 150 may receive the sensing voltage VSEN from the display panel 110. The sensing circuit 150 may sense a characteristic of each of the pixels PX through the sensing voltage VSEN. In an embodiment, the sensing circuit 150 may sense a characteristic of a driving transistor T1 in FIG. 2 (e.g., a threshold voltage or a mobility of the driving transistor T1) included in each of the pixels PX and/or a characteristic of the light emitting element LE in FIG. 2 (e.g., a threshold voltage of the light emitting element LE).

The timing controller 160 may control an operation of the scan driver 120, an operation of the data driver 130, and an operation of the sensing circuit 150. The timing controller 160 may provide a control signal to each of the scan driver 120, the data driver 130, and the sensing circuit 150, and may provide image data to the data driver 130.

Figure 2:
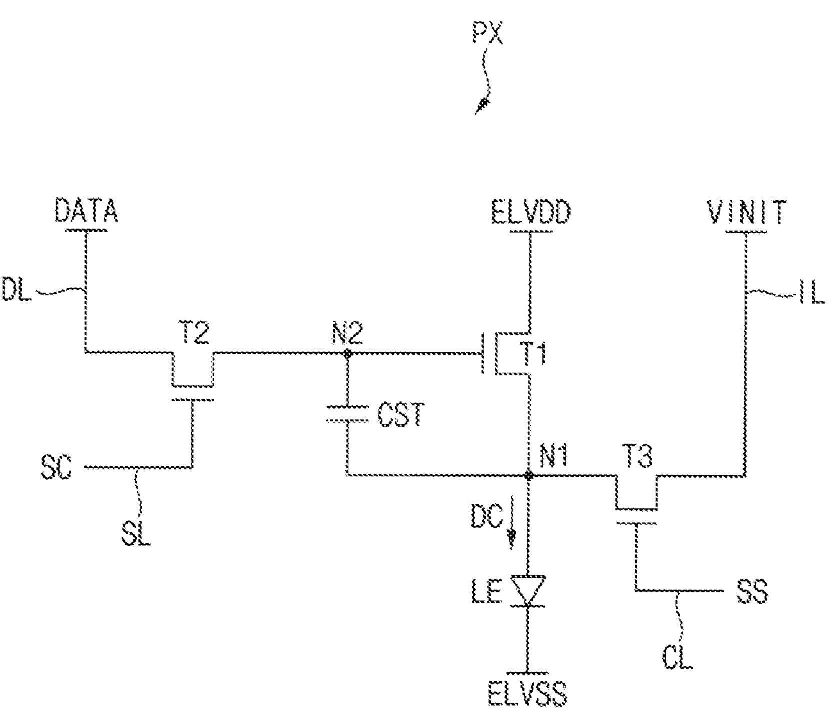
FIG. 2 is a circuit diagram of a representative pixel of a display panel of the display device of FIG. 1.

FIG. 2 is a circuit diagram illustrating the pixel PX according to an embodiment.

Referring to FIG. 2, the pixel PX may include a first transistor T1, a second transistor T2, a third transistor T3, a storage capacitor CST, and a light emitting element LE.

The first transistor T1 may be connected between a first power line for providing the first power voltage ELVDD and a first node N1, and may be turned on in response to a voltage of a second node N2 (e.g., when the voltage of the second node N2 is a gate-on voltage). A first electrode of the first transistor T1 may receive the first power voltage ELVDD, a second electrode of the first transistor T1 may be connected to the first node N1, and a gate electrode of the first transistor T1 may be connected to the second node N2. The first transistor T1 may provide a driving current DC to the light emitting element LE based on a voltage stored in the storage capacitor CST.

The second transistor T2 may be connected between a data line DL for providing the data voltage DATA and the second node N2, and may be turned on in response to the scan signal SC (e.g., when the scan signal SC is a gate-on voltage). A first electrode of the second transistor T2 may be connected to the data line DL, a second electrode of the second transistor T2 may be connected to the second node N2, and a gate electrode of the second transistor T2 may be connected to a scan line SL. The second transistor T2 may provide the data voltage DATA to the second node N2 based on the scan signal SC.

The third transistor T3 may be connected between an initialization line IL for providing the initialization voltage VINIT and the first node N1, and may be turned on in response to the control signal SS (e.g., when the control signal SS is a gate-on voltage). A first electrode of the third transistor T3 may be connected to the initialization line IL, a second electrode of the third transistor T3 may be connected to the first node N1, and a gate electrode of the third transistor T3 may be connected to a control line CL. The third transistor T3 may provide the initialization voltage VINIT to the first node N1 based on the control signal SS. Further, the third transistor T3 may provide a voltage of the first node N1 to the initialization line IL based on the control signal SS.

In an embodiment, each of the first transistor T1, the second transistor T2, and the third transistor T3 may be an NMOS transistor. Accordingly, a gate-on voltage for turning on the first transistor T1, the second transistor T2, and the third transistor T3 may be a logic high voltage.

In an embodiment, each of the first transistor T1, the second transistor T2, and the third transistor T3 may be an oxide semiconductor transistor. In other words, each of the first transistor T1, the second transistor T2, and the third transistor T3 may include an active layer formed of an oxide semiconductor.

The storage capacitor CST may be connected between the first node N1 and the second node N2. A first electrode of the storage capacitor CST may be connected to the first node N1, and a second electrode of the storage capacitor CST may be connected to the second node N2. The storage capacitor CST may store a voltage corresponding to a voltage difference between the first node N1 and the second node N2.

The light emitting element LE may be connected between a second power line for providing the second power voltage ELVSS and the first node N1. An anode electrode of the light emitting element LE may be connected to the first node N1, and a cathode electrode of the light emitting element LE may receive the second power voltage ELVSS. The light emitting element LE may emit light based on the driving current DC.

In an embodiment, the light emitting element LE may be an organic light emitting diode (OLED). In another embodiment, the light emitting element LE may be an inorganic light emitting diode or a quantum dot light emitting diode.

Figure 3:
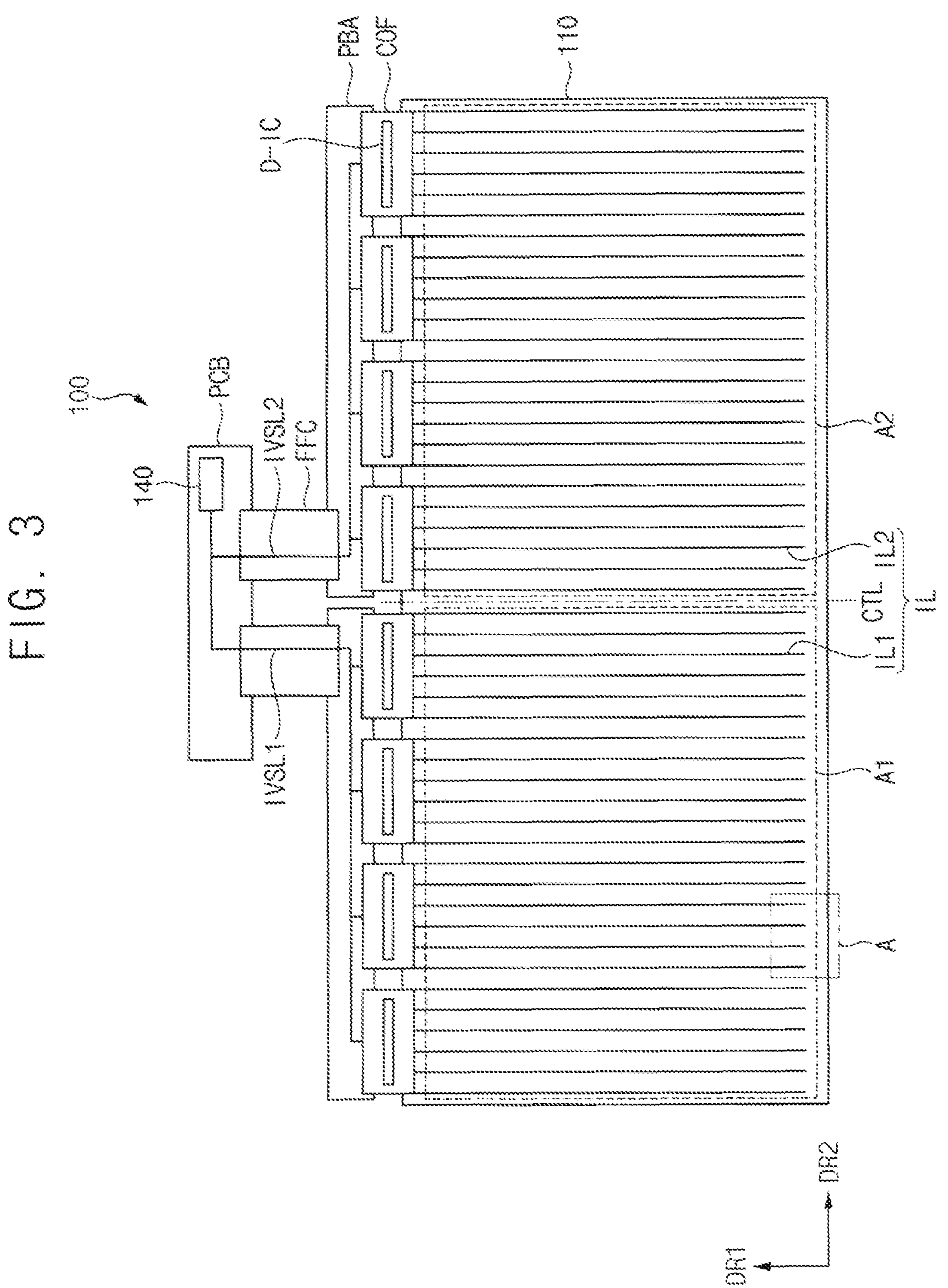
FIG. 3 is a plan view of the display device of FIG. 1.

FIG. 3 is a plan view illustrating the display device 100 according to an embodiment.

Referring to FIG. 3, the display device 100 may include a display panel 110, chip-on-films COF, printed board assemblies PBA, flexible cables FFC, a printed circuit board PCB, a first initialization voltage supply line IVSL1, and a second initialization voltage supply line IVSL2.

The display panel 110 may include initialization lines IL. Each of the initialization lines IL may extend in a first direction DR1. The initialization lines IL may be arranged in a second direction DR2 intersecting the first direction DR1. Each of the initialization lines IL may transmit the initialization voltage VINIT or the sensing voltage VSEN.

The display panel 110 may include a first area A1 and a second area A2. The first area A1 may be positioned on one side of the display panel 110 with respect to an imaginary center line CTL passing through a center portion of the display panel 110 and parallel to the initialization lines IL. For example, the first area A1 may be positioned on the left side of the display panel 110 with respect to the center line CTL. The second area A2 may be positioned on the other side of the display panel 110 with respect to the center line CTL. For example, the second area A2 may be positioned on the right side of the display panel 110 with respect to the center line CTL.

The chip-on-films COF may be connected to the display panel 110. The chip-on-films COF may be positioned in the first direction DR1 from the display panel 110. Although FIG. 3 illustrates that the display device 100 includes eight chip-on-films COF, the number of the chip-on-films COF is not limited thereto.

Each of the chip-on-films COF may include a driving integrated circuit D-IC. In an embodiment, the driving integrated circuit D-IC may include the data driver 130 in FIG. 1, the sensing circuit 150 in FIG. 1, and/or a switch SW in FIG. 6.

The printed board assemblies PBA may be connected to the chip-on-films COF. Each of the printed board assemblies PBA may be connected to a plurality of chip-on-films COF. The printed board assemblies PBA may be positioned in the first direction DR1 from the chip-on-films COF. Although FIG. 3 illustrates that the display device 100 includes two printed board assemblies PBA, the number of the printed board assemblies PBA is not limited thereto.

The flexible cables FFC may be connected to the printed board assemblies PBA. The flexible cables FFC may be respectively connected to the printed board assemblies PBA. The flexible cables FFC may be positioned in the first direction DR1 from the printed board assemblies PBA.

The printed circuit board PCB may be connected to the flexible cables FFC. The printed circuit board PCB may be positioned in the first direction DR1 from the flexible cables FFC. The printed circuit board PCB may include the power supply 140.

The first initialization voltage supply line IVSL1 and the second initialization voltage supply line IVSL2 may be disposed on the printed board assemblies PBA, the flexible cables FFC, and the printed circuit board PCB. The first initialization voltage supply line IVSL1 and the second initialization voltage supply line IVSL2 may be connected to the power supply 140. The first initialization voltage supply line IVSL1 may provide the initialization voltage VINIT to first initialization lines IL1 disposed in the first area A1 of the display panel 110 among the initialization lines IL from the power supply 140. The second initialization voltage supply line IVSL2 may provide the initialization voltage VINIT to second initialization lines IL2 disposed in the second area A2 of the display panel 110 among the initialization lines IL from the power supply 140.

When a ripple occurs in one of the initialization voltage VINIT transmitted by the first initialization voltage supply line IVSL1 and the initialization voltage VINIT transmitted by the second initialization voltage supply line IVSL2, a deviation may occur between the initialization voltage VINIT transmitted by the first initialization lines IL1 and the initialization voltage VINIT transmitted by the second initialization lines IL2. When the deviation occurs between the initialization voltages VINIT, brightness of an image displayed in the first area A1 may be different from brightness of an image displayed in the second area A2, and accordingly, a boundary between the first area A1 and the second area A2 may be visually recognized.

Figure 4:
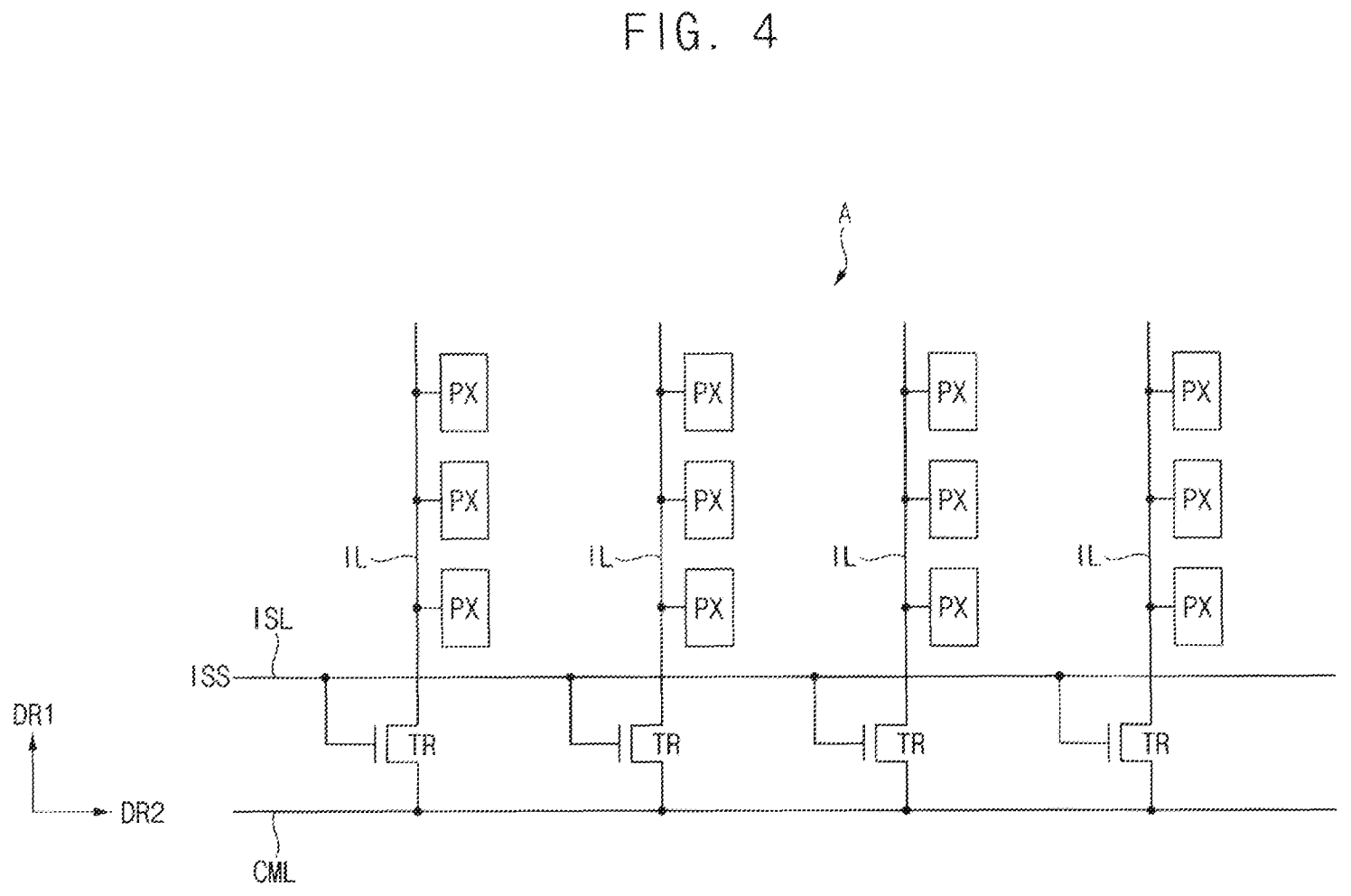

FIG. 4 is a diagram illustrating an example of an area A in FIG. 3.

Referring to FIG. 4, the display panel 110 may include the pixels PX, the initialization lines IL, a common line CML, an initialization synchronization line ISL, and a plurality of switching elements in the form of transistors TR.

Each of the initialization lines IL may be connected to the plurality of pixels PX. Each of the initialization lines IL may provide the initialization voltage VINIT to the pixels PX connected thereto. Further, each of the initialization lines IL may receive the sensing voltage VSEN from the pixels PX connected thereto. In an embodiment, each of the initialization lines IL may be connected to the pixels PX disposed in one pixel column. In another embodiment, each of the initialization lines IL may be connected to the pixels PX disposed in a plurality of pixel columns.

The common line CML may be physically separated from the initialization lines IL. The common line CML may extend in the second direction DR2. The common line CML may be disposed on the other side opposite to one side of the display panel 110 to which the chip-on-films COF are connected. For example, when the chip-on-films COF are connected to the upper side of the display panel 110, the common line CML may be disposed on the lower side of the display panel 110. Alternatively, the common line CML may be provided in plural. For example, the common line CML may be disposed in the lower area of the display panel 110 and/or in the center area of the display panel.

The initialization synchronization line ISL may transmit the initialization synchronization signal ISS. The scan driver 120 in FIG. 1 may provide the initialization synchronization signal ISS to the initialization synchronization line ISL. The initialization synchronization line ISL may be connected to gate electrodes of the transistors TR.

Each of the transistors TR may be connected between each of the initialization lines IL and the common line CML, and may be turned on in response to the initialization synchronization signal ISS (e.g., when the initialization synchronization signal ISS is a gate-on voltage). The number of the transistors TR may be equal to the number of the initialization lines IL. A first electrode of each of the transistors TR may be connected to a respective one of the initialization lines IL, a second electrode of each of the transistors TR may be connected to the common line CML, and a gate electrode of each of the transistors TR may be connected to the initialization synchronization line ISL. The transistors TR may connect the initialization lines IL to the common line CML based on the initialization synchronization signal ISS. For example, The transistors TR may be simultaneously turned on and off by the initialization synchronization signal ISS. Alternatively, the initialization synchronization line ISL may be provided in plural, and the gate electrodes of the transistors TR may be controlled individually or selectively.

In an embodiment, each of the transistors TR may be an NMOS transistor. Accordingly, a gate-on voltage that turns on the transistors TR may be a logic high voltage.

In an embodiment, each of the transistors TR may be an oxide semiconductor transistor. In other words, each of the transistors TR may include an active layer formed of an oxide semiconductor.

When the transistors TR are turned on, the initialization lines IL may be connected to the common line CML by the transistors TR. Accordingly, the initialization lines IL may be electrically connected, and a deviation in the initialization voltages VINIT transmitted by the initialization lines IL may be reduced. When the transistors TR are turned off, the initialization lines IL may be separated from the common line CML. Accordingly, the initialization lines IL may be electrically separated, and the initialization lines IL may transmit the sensing voltages VSEN from the pixels PX to the sensing circuit 150. For example, when the transistors TR are turned off, the common line CML may have a floating state. Alternatively, when the transistors TR are turned off, the common line CML may have a predetermined voltage level, e.g., a ground voltage, the first power voltage ELVDD, or the second power voltage ELVSS.

Figure 5:
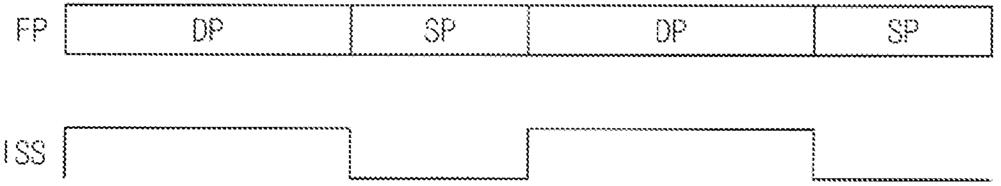
FIG. 5 is a timing diagram for describing an embodiment of a method of driving the display device of FIG. 1 according to the principles of the invention.
Figure 6:
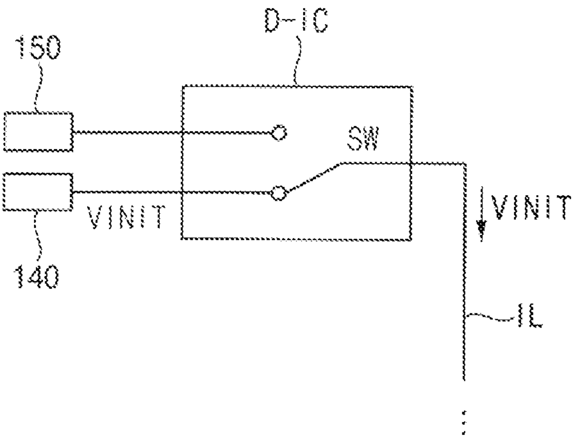
FIG. 6 is a diagram for describing connection status of an initialization line in a display period.
Figure 7:
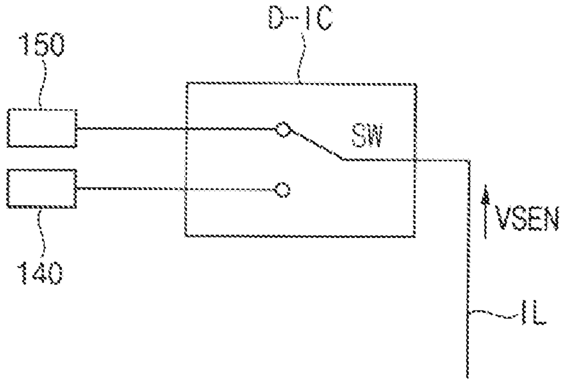
FIG. 7 is a diagram for describing connection status of an initialization line in a sensing period.

FIG. 5 is a timing diagram for describing a method of driving a display device according to an embodiment. FIG. 6 is a diagram for describing connection status of the initialization line IL in a display period DP. FIG. 7 is a diagram for describing connection status of an initialization line IL in a sensing period SP.

Referring to FIGS. 2, 4, 5, 6, and 7, a frame period FP of the display device 100 may include a display period DP and a sensing period SP. The display period DP may be a period in which each of the pixels PX emits light. The sensing period SP may be a period in which a characteristic of each of the pixels PX is sensed.

In the display period DP, the scan signal SC and the control signal SS may be provided to the pixel PX. Accordingly, the data voltage DATA for displaying an image may be applied to the second node N2 through the data line DL, and the initialization voltage VINIT may be applied to the first node N1 through the initialization line IL.

Then, the supply of the scan signal SC and the control signal SS to the pixel PX may be stopped during the display period DP. Accordingly, the first transistor T1 may generate the driving current DC based on the voltage stored in the storage capacitor CST, and the light emitting element LE may emit light based on the driving current DC.

In the display period DP, the initialization synchronization signal ISS may have a logic high voltage, and the transistors TR may be turned on. Accordingly, in the display period DP, the initialization lines IL may be electrically connected via the common line CML. In the display period DP, a switch SW may connect each of the initialization lines IL to the power supply 140, and the initialization voltage VINIT may be applied to each of the initialization lines IL from the power supply 140. Accordingly, the initialization voltages VINIT may be applied to the initialization lines IL electrically connected to each other during the display period DP, and a deviation in the initialization voltages VINIT may be reduced.

In the sensing period SP, the scan signal SC and the control signal SS may be provided to the pixel PX. Accordingly, a voltage for sensing a characteristic of the first transistor T1 and/or a characteristic of the light emitting element LE may be applied to the second node N2 through the data line DL, and a voltage for initializing the first node N1 may be applied to the first node N1 through the initialization line IL.

Then, the supply of the scan signal SC to the pixel PX may be stopped during the sensing period SP. Accordingly, the sensing voltage VSEN including information regarding the characteristic of the first transistor T1 and/or the characteristic of the light emitting element LE may be generated at the first node N1, and the sensing voltage VSEN may be provided to the sensing circuit 150 through the initialization line IL.

In the sensing period SP, the initialization synchronization signal ISS may have a logic low voltage, and the transistors TR may be turned off. Accordingly, the initialization lines IL may be electrically disconnected during the sensing period SP. In the sensing period SP, the switch SW may connect each of the initialization lines IL to the sensing circuit 150, and sensing voltages VSEN may be applied to the initialization lines IL from the pixels PX. Accordingly, sensing voltages VSEN may be respectively applied to the initialization lines IL that are electrically separated from each other during the sensing period SP, and the sensing circuit 150 may sense characteristics of the pixels PX through the sensing voltages VSEN.

Figure 8:
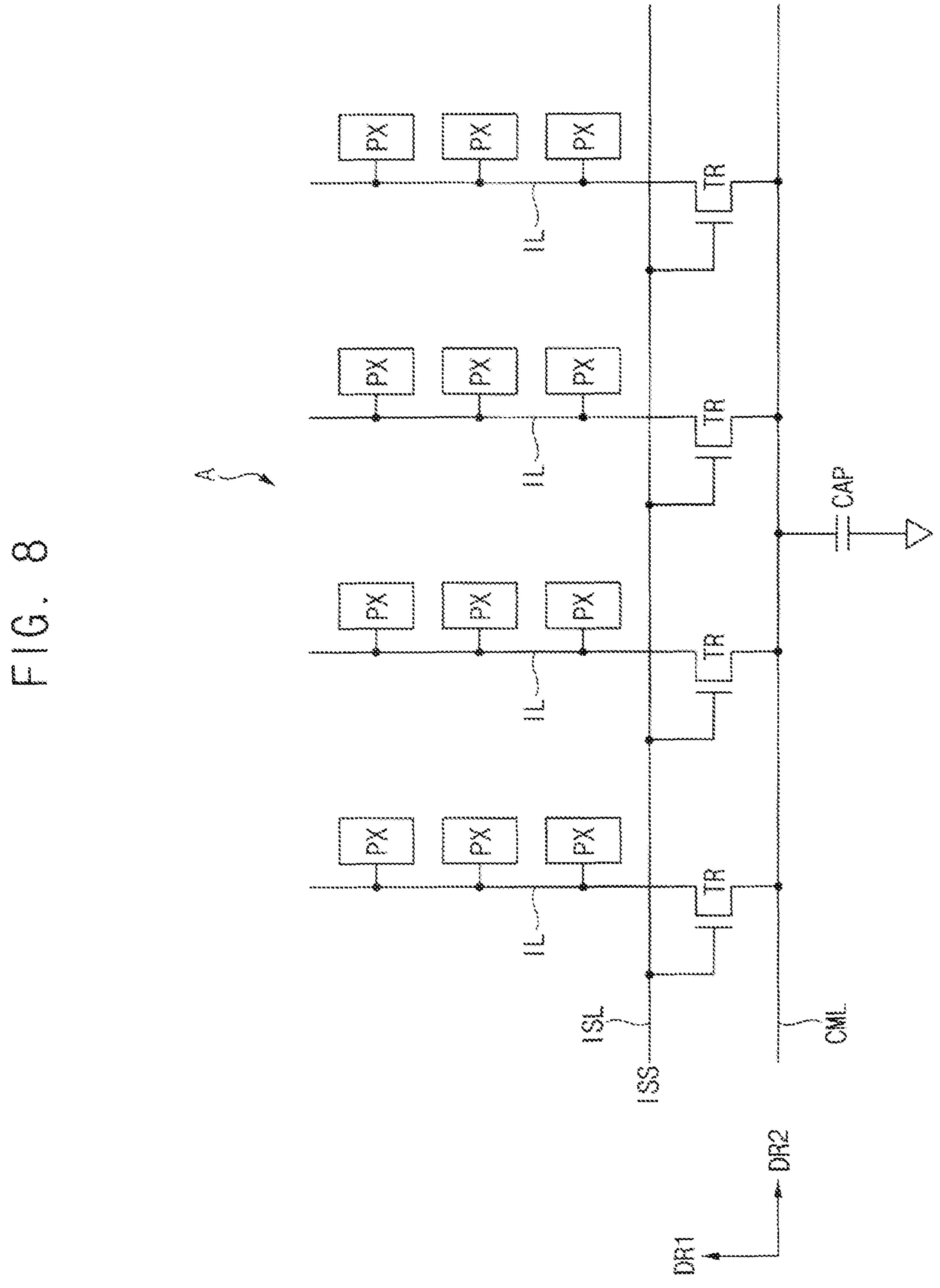
FIG. 8 is a diagram illustrating another example of an area A of FIG. 3.

FIG. 8 is a diagram illustrating another example of an area A in FIG. 3.

Referring to FIG. 8, the display panel 110 may include pixels PX, initialization lines IL, a common line CML, an initialization synchronization line ISL, transistors TR, and a capacitor CAP. The display panel 110 described with reference to FIG. 8 may be substantially the same as or similar to the display panel 110 described with reference to FIG. 4 except for further including the capacitor CAP. Accordingly, descriptions of the overlapping components will be omitted for descriptive convenience.

The capacitor CAP may be connected to the common line CML. In an embodiment, a first electrode of the capacitor CAP may be connected to the common line CML, and a second electrode of the capacitor CAP may be connected to a ground. As the common line CML is connected to the capacitor CAP, the initialization voltage VINIT of the common line CML may maintain, and the initialization voltage VINIT may be stabilized. For example, the capacitor CAP may store the initialization voltage VINIT although the transistors TR are turned off to disconnect the common line CML from the initialization lines IL. Accordingly, when the transistors TR are turned on to connect the common line CML to the initialization lines IL, the initialization voltage VINIT stored in the capacitor CAP may be applied to the initialization lines IL.

Figure 9:
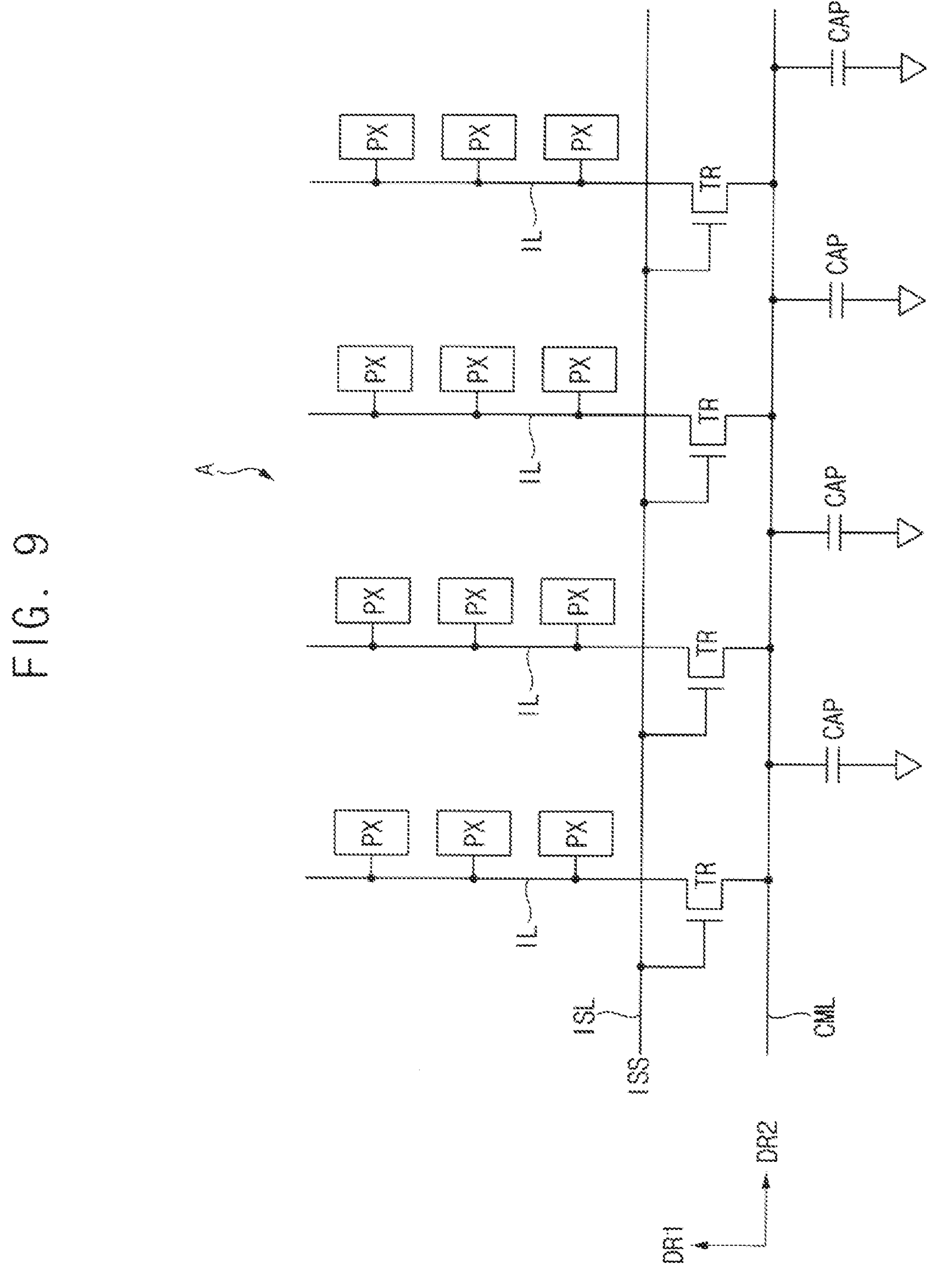
FIG. 9 is a diagram illustrating another example of an area A of FIG. 3.

FIG. 9 is a diagram illustrating another example of an area A in FIG. 3.

Referring to FIG. 9, the display panel 110 may include pixels PX, initialization lines IL, a common line CML, an initialization synchronization line ISL, transistors TR, and a plurality of capacitors CAP. The display panel 110 described with reference to FIG. 9 may be substantially the same as or similar to the display panel 110 described with reference to FIG. 8 except for further including the plurality of capacitors CAP. Accordingly, descriptions of the overlapping components will be omitted for descriptive convenience.

The capacitors CAP may be connected to the common line CML. In an embodiment, the number of the capacitors CAP may be equal to the number of the transistors TR. For example, the capacitors CAP may be disposed adjacent to the transistors TR corresponding thereto, respectively. As the common line CML is connected to the plurality of capacitors CAP, uniformity of the initialization voltage VINIT applied to the common line CML may be improved.

Figure 10:
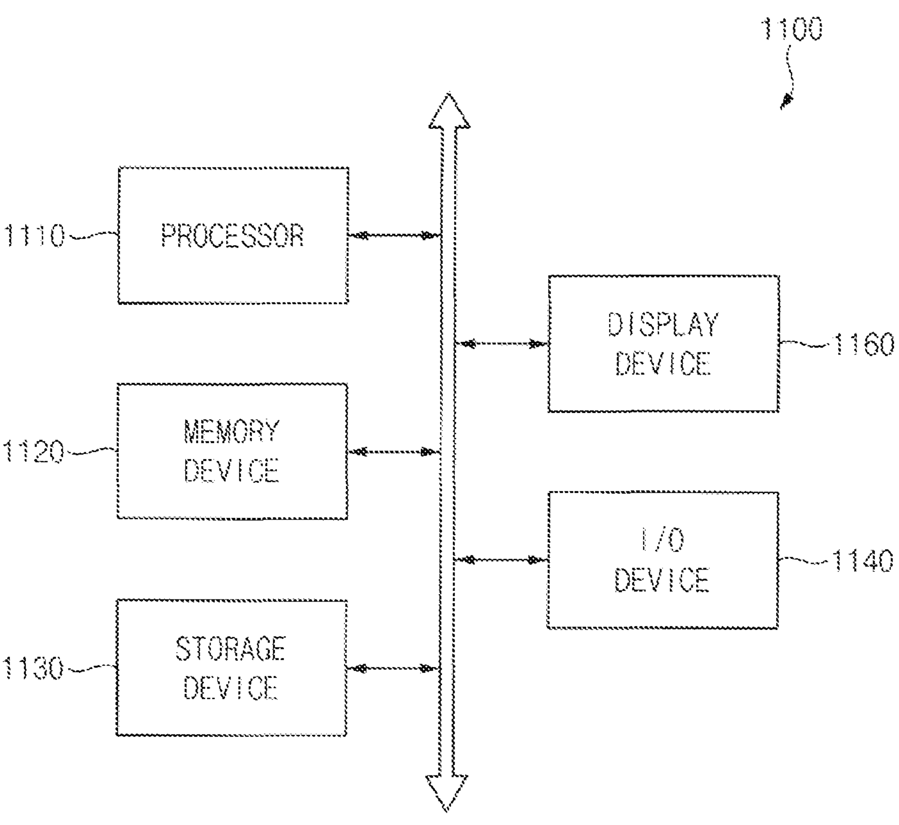
FIG. 10 is a block diagram of an embodiment of an electronic apparatus including the display device of FIG. 1 constructed according to the principles of the invention.

FIG. 10 is a block diagram illustrating an electronic apparatus 1100 including a display device 1160 according to an embodiment.

Referring to FIG. 10, the electronic apparatus 1100 may include a processor 1110, a memory device 1120, a storage device 1130, an input/output ("I/O") device 1140, and a display device 1160. The electronic apparatus 1100 may further include a plurality of ports for communicating with a video card, a sound card, a memory card, a universal serial bus ("USB") device, etc.

The processor 1110 may perform particular calculations or tasks. In an embodiment, the processor 1110 may be a microprocessor, a central processing unit ("CPU"), or the like. The processor 1110 may be coupled to other components via an address bus, a control bus, a data bus, or the like. In an embodiment, the processor 1110 may be coupled to an extended bus such as a peripheral component interconnection ("PCI") bus.

The memory device 1120 may store data for operations of the electronic apparatus 1100. In an embodiment, the memory device 1120 may include a non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or a volatile memory device such as a dynamic random access memory ("DRAM") device, a static random access memory ("SRAM") device, a mobile DRAM device, etc.

The storage device 1130 may include a solid state drive ("SSD") device, a hard disk drive ("HDD") device, a CD-ROM device, or the like. The I/O device 1140 may include an input device such as a keyboard, a keypad, a touchpad, a touch-screen, a mouse device, etc., and an output device such as a speaker, a printer, etc. The display device 1160 may be coupled to other components via the buses or other communication links.

In the display device 1160, as the initialization lines are connected to the common line, a deviation in initialization voltages transmitted by the initialization lines may be reduced. Further, as the connection between the initialization lines and the common line is controlled by the transistors, provision of the initialization voltages by the initialization lines and sensing of characteristics of the pixels may be selectively performed.

The display device according to the embodiments may be applied to a display device included in a computer, a notebook, a mobile phone, a smart phone, a smart pad, a PMP, a PDA, an MP3 player, or the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel, comprising:

a plurality of pixels;

a plurality of initialization lines for providing an initialization voltage to the plurality of pixels;

a common line physically separated from the plurality of initialization lines;

a plurality of switching elements each having a first electrode connected to a respective one of the plurality of initialization lines and a second electrode directly connected to the common line; and one or more capacitors, wherein the common line is between the one or more capacitors and the plurality of switching elements, and wherein the common line is configured to electrically connect the one or more capacitors to the plurality of switching elements.

2. The display panel of claim 1, further comprising:

an initialization synchronization line connected to gate electrodes of the plurality of switching elements.

3. The display panel of claim 1, wherein the plurality of switching elements are turned on in a display period in which each of the plurality of pixels emits light, and wherein the plurality of switching elements are turned off in a sensing period in which a characteristic of each of the plurality of pixels is sensed.

4. The display panel of claim 1, wherein each of the plurality of initialization lines extends in a first direction, and wherein the common line extends in a second direction intersecting the first direction.

5. The display panel of claim 1, wherein the one or more capacitors further comprises:

a plurality of capacitors connected to the common line.

6. The display panel of claim 5, wherein a number of the plurality of capacitors is equal to a number of the plurality of switching elements.

7. The display panel of claim 1, wherein each of the plurality of switching elements is an NMOS transistor.

8. The display panel of claim 1, wherein each of the plurality of switching elements is an oxide semiconductor transistor.

9. The display panel of claim 1, wherein each of the plurality of pixels includes:

a first transistor connected between a first power line for providing a first power voltage and a first node, the first transistor having a gate electrode connected to a second node;

a second transistor connected between a data line for providing a data voltage and the second node, the second transistor being turned on in response to a scan signal;

a third transistor connected between a respective one of the plurality of initialization lines and the first node, the third transistor being turned on in response to a control signal;

a storage capacitor connected between the first node and the second node; and a light emitting element connected between a second power line for providing a second power voltage and the first node.

* * * * *